(12) United States Patent
He et al.

(10) Patent No.: US 9,072,161 B2
(45) Date of Patent: Jun. 30, 2015

(54) ELECTRO-STATIC SHIELDING APPARATUS, ELECTRONIC DEVICE, AND METHOD FOR MANUFACTURING SAID ELECTRO-STATIC SHIELDING APPARATUS

(75) Inventors: Qingqing He, Beijing (CN); Yuanna Hu, Beijing (CN); Jin Jin, Beijing (CN)

(73) Assignee: ERICSSON (CHINA) COMMUNICATIONS CO., LTD., Beijing (CN)

( * ) Notice: Subject to any disclaimer, the term of this patent is extended or adjusted under 35 U.S.C. 154(b) by 149 days.

(21) Appl. No.: 14/003,110

(22) PCT Filed: Feb. 6, 2012

(86) PCT No.: PCT/CN2012/000144
§ 371 (c)(1),
(2), (4) Date: Sep. 4, 2013

(87) PCT Pub. No.: WO2012/126269
PCT Pub. Date: Sep. 27, 2012

(65) Prior Publication Data
US 2013/0343020 A1     Dec. 26, 2013

(30) Foreign Application Priority Data
Mar. 18, 2011   (CN) .......................... 2011 1 0066092

(51) Int. Cl.
*H05K 9/00*     (2006.01)
*H05K 3/10*     (2006.01)

(52) U.S. Cl.
CPC .. *H05K 9/00* (2013.01); *H05K 3/10* (2013.01); *Y10T 29/49155* (2015.01); *H05K 9/0067* (2013.01)

(58) Field of Classification Search
CPC .. H05K 9/0045; H05K 9/0047; H05K 9/0049
See application file for complete search history.

(56) References Cited

U.S. PATENT DOCUMENTS

| | | | |
|---|---|---|---|
| 5,005,106 A * | 4/1991 | Kiku | ............................. 361/818 |
| 7,135,644 B1 | 11/2006 | Gilliland et al. | |
| 2003/0015334 A1* | 1/2003 | Clement et al. | .................. 174/50 |
| 2006/0097059 A1 | 5/2006 | Miyazaki | |
| 2006/0116014 A1 | 6/2006 | Son et al. | |
| 2009/0262510 A1 | 10/2009 | Pekkarinen et al. | |
| 2010/0140359 A1 | 6/2010 | Hamm et al. | |

FOREIGN PATENT DOCUMENTS

| | | |
|---|---|---|
| CN | 101267706 A | 9/2008 |
| CN | 101287328 A | 10/2008 |

(Continued)

*Primary Examiner* — Hung V Ngo
(74) *Attorney, Agent, or Firm* — Coats & Bennett, PLLC (57) ABSTRACT

This invention provides an Electro-Static shielding apparatus, an electronic device, and a method for manufacturing said Electro-Static shielding apparatus. Said Electro-Static shielding apparatus comprises: a base layer; a printed circuit block embedded into the base layer; an Electro-Static shielding layer located on an upper surface of the base layer and at least covering sensitive areas, the sensitive areas are those corresponding to the areas required to be shielded on the printed circuit block; and an insulating layer for at least covering the Electro-Static shielding layer. According to the technical solution of this invention, an effective shielding effect can be achieved, moreover, the manufacture cost can be reduced and a good flatness will be reached.

14 Claims, 3 Drawing Sheets

(56) References Cited

FOREIGN PATENT DOCUMENTS

| | | | |
|---|---|---|---|
| CN | 101751602 A | 6/2010 | |
| DE | 3403201 A1 | 8/1985 | |
| EP | 0397185 A1 | 11/1990 | |
| WO | 2005029937 A1 | 3/2005 | |

* cited by examiner

ELECTRO-STATIC SHIELDING APPARATUS, ELECTRONIC DEVICE, AND METHOD FOR MANUFACTURING SAID ELECTRO-STATIC SHIELDING APPARATUS

FIELD OF THE INVENTION

The present invention generally relates to the electronic component protection field, and specifically relates to an Electro-Static shielding apparatus, an electronic device comprising said Electro-Static shielding apparatus, and a method for manufacturing said Electro-Static shielding apparatus.

BACKGROUND OF THE INVENTION

In order to prevent external fields from entering into the areas in need of protection in an electronic device, it is usually required to protect the electronic device using shielding technology. Currently, various shielding methods have been developed to protect the electronic device against damage from external electrostatic discharge. The active overlay technology used for electrostatic discharge shielding mainly aims at the research on shielding materials and shielding layers based on a flexible printed circuit board. For example, the Chinese application for a patent for invention under publication number CN101267706A discloses a technical solution as to electrostatic discharge shielding materials in which an anti-electrostatic shielding sheet with a multi-layer structure is designed, including various combined design schemes of anti-electrostatic layer, shielding layer, and filling layer. In addition, the Chinese application for a patent for invention under the publication number CN101287328A discloses a technical solution of a flexible printed circuit board which combines shielding function, wherein the internal of the flexible printed circuit board is provided with a grounding electrostatic shield to provide stable anti-electromagnetic interference protection for the placement section of electronic elements.

However, the design of the multi-layer structure or the design of the flexible printed circuit board which combines shielding function still has deficiencies. For example, in the case of the design of the multi-layer structure, said multi-layer structure almost completely covers the external of the electronic device, but it is unconsidered which areas are required to be covered, this causes waste in the manufacture cost. In addition, due to attached components on the flexible printed circuit board, when these components are covered by the multi-layer structure, the thickness of the whole active overlay is uneven, in particular, the places of these components where are covered by the multi-layer structure would be higher than other positions, this brings difficulties to flatness control of the whole active overlay. Moreover, in the case of the design of the flexible printed circuit board that combines shielding function, there also exists the problem of waste in the manufacture cost.

In order to reduce the manufacture cost, those skilled in the art conceived of using net active overlay to replace the original design concept of completely covering the external surface of the electronic device, namely making a hole in the active overlay at corresponding positions of the electronic components not in need of protection, in this way the corresponding electronic components are not covered by the active overlay, thereby reducing the manufacture cost and relieving the deficiencies that the active overlay near the electronic components is too thick and the flatness is too poor. However, this also leads to risks that the electronic components in need of protection are not protected by the electrostatic shielding.

Moreover, there is interference between the net active overlay and attached electronic components, for example if an LED is covered by the net active overlay, the net active overlay may cause uneven shadow present in the transmission light.

Consequently, there is an urgent need to improve the electrostatic shielding technology in the art.

OBJECT AND SUMMARY OF THE INVENTION

To this end, the present invention provides an improved scheme of electrostatic shielding, which can solve or at least relieve at least part of the deficiencies existing in the prior art.

According to a first aspect of the present invention, an Electro-Static shielding apparatus is provided. Said apparatus may comprise: a base layer; a printed circuit board embedded into the base layer; an Electro-Static shielding layer located on an upper surface of the base layer and can at least covering sensitive areas, the sensitive areas are those corresponding to the areas required to be shielded on the printed circuit board; and an insulating layer for at least covering the Electro-Static shielding layer.

According to one preferred embodiment of the present invention, said Electro-Static shielding layer may be embedded into a reserved groove in the upper surface of the base layer and leveled with the upper surface of the base layer.

According to another preferred embodiment of the present invention, the surface of the printed circuit board which is provided with an element required to be shielded may be attached to a reserved groove in a lower surface of the base layer, and the printed circuit board may be leveled with the lower surface of the base layer.

According to one embodiment of the present invention, the element required to be shielded may be a light-emitting element.

According to another preferred embodiment of the present invention, the insulating layer, the Electro-Static shielding layer, and the base layer may be made of materials that can transmit light emitted from the light-emitting element.

According to another preferred embodiment of the present invention, the surface of the printed circuit board which is opposite to the surface provided with the element required to be shielded may be attached to the reserved groove in the upper surface of the base layer.

According to another preferred embodiment of the present invention, the Electro-Static shielding layer may be attached to the surface of the printed circuit board which is provided with the element required to be shielded, and leveled with the upper surface of the base layer.

According to another preferred embodiment of the present invention, the exposed trace on the printed circuit board may be arranged on the surface of the printed circuit board which is opposite to the surface provided with the element required to be shielded.

According to one embodiment of the present invention, the element required to be shielded may be a switch.

According to another preferred embodiment of the present invention, the sensitive areas are areas corresponding to the printed circuit board in the above embodiments of the present invention.

According to another preferred embodiment of the present invention, the sensitive areas are areas corresponding to key components on the printed circuit board in the above embodiments of the present invention.

According to another preferred embodiment of the present invention, the printed circuit board is a flexible printed circuit board.

According to a second aspect of the present invention, an electronic device is further provided, which comprises the Electro-Static shielding apparatus according to the first aspect of the present invention.

In addition, according to a third aspect of the present invention, a method for manufacturing said Electro-Static shielding apparatus is further provided. Said method may comprise the following steps: providing a base layer; embedding a printed circuit board into the base layer; arranging an Electro-Static shielding layer on an upper surface of the base layer so as to at least cover sensitive areas, said sensitive areas are those corresponding to the areas required to be shielded on the printed circuit board; and providing an insulating layer to at least cover the Electro-Static shielding layer.

Compared with the prior art, the technical solution provided in the present invention can not only guarantee the electrostatic shielding effect, but also reduce the manufacture cost and improve the flatness of the device surface.

According to the present invention, a printed circuit board is embedded into a base layer, and an Electro-Static shielding layer and an insulating layer is provided on an upper surface of the base layer so as to perform electrostatic shielding of sensitive areas in the printed circuit board. The resultant Electro-Static shielding apparatus has flatness that can be more easily controlled, and achieves more effective electrostatic shielding protection. In addition, other performances of the Electro-Static shielding apparatus would be more flexible and further enhanced by means of the electrostatic shielding design process and layer order according to the present invention. For example, the brightness of an electronic component such as an LED can be controlled by means of the thickness of the base layer; the sensitivity of the electronic component can be controlled by means of the distance from the electronic component such as a switch to the insulating layer. Moreover, since the sensitive areas in need of protection have been taken into consideration during the manufacture process of the Electro-Static shielding apparatus, the manufacture cost can be saved.

BRIEF DESCRIPTION OF THE DRAWINGS

Through the following detailed description in combination with the embodiments shown by the drawings, the above and other features of the present invention will become more apparent. In the drawings, the same or similar reference signs represent same or similar components, wherein.

DETAILED DESCRIPTION OF EMBODIMENTS

The present invention will be explained in detail below by reference to the drawings and in combination with the schematic embodiments thereof.

It is required to make it clear that the terms as to positions and directions which are mentioned in the present invention, such as "upper", "lower", refer to the directions observed in front of the figures. For example, the position at the upper part of an element shown in the figures is referred to as "upper", and the position at the lower part of the element shown in the figures is referred to as "lower". Therefore, the terms as to positions and directions such as "upper", "lower" in the present invention only represent relative positional relations shown in the figures, which are provided out of the purpose of explanation, rather than being intended to restrict the scope of the present invention.

Figure 1:
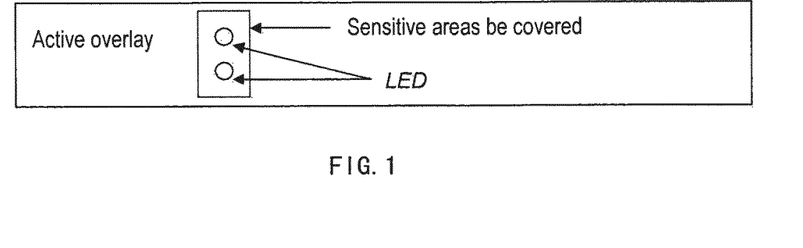
FIG. 1 schematically illustrates a diagram of the inventive theory of the present invention.

Firstly referring to FIG. 1, FIG. 1 schematically illustrates the inventive theory of the present invention. According to the present invention, the sizes of sensitive areas are first determined according to geometric analysis, which sensitive areas are areas corresponding to those required to be shielded in the printed circuit board. FIG. 1 schematically shows the situation of active overlay for two light-emitting diodes (LEDs) arranged in parallel, wherein the designed sensitive areas are a rectangle. It is required to make it clear that key components in need of active overlay may be of other types or shapes, thus the designed sensitive areas should also be adaptive shapes, such as circle, ellipse, etc. Accordingly, the design of the sensitive areas of the present invention is not limited to a rectangle. In addition, FIG. 1 takes the light-emitting diode (LED) as an example, however, the present invention is not limited to the case of LED, the electronic components required to be covered may also be other key components such as a switch, etc.

The key components are usually mounted on a circuit board, such as a printed circuit board (PCB) like a soft printed circuit board, thus in fact the sensitive areas are substantially designed around the PCB, in particular, around the key components on the PCB. These key components play a very important role in carrying out the function of the electronic device or electronic system, thus they require reliable electrostatic shielding protection. It is apparent that if there are several key components on the PCB, all the key components can be subjected to geometrical analysis as a whole to determine the sizes of sensitive areas required for protection of all the key components, and an Electro-Static shielding layer is designed on such a basis. Of course, each key component requires active overlay respectively, namely the geometrical analysis is conducted respectively with regard to each key component so as to determine the size of the sensitive area of each key component to be actively overlaid, and then respective Electro-Static shielding layers are designed and arranged to cover the corresponding sensitive areas.

As shown in FIG. 1, the area to which an LED corresponds is an area with the greatest sensitivity, which is also an area that needs electrostatic shielding most. To this end, the Electro-Static shielding apparatus designed in the present invention just covers the area with the greatest sensitivity, and no Electro-Static shielding layers are designed and arranged for the areas relatively distant from the LED.

As for determining the sizes of sensitive areas using a method of geometrical analysis as stated above, it is easy for those skilled in the art to carry it out. Those skilled in the art are able to find suitable design schemes by means of making experiments according to the teaching of the present invention and the technical knowledge mastered by them. Therefore, it will not be repeated herein for conciseness.

After designing the specific sizes and shapes of the sensitive areas, it is possible to design an Electro-Static shielding apparatus based on the sizes and shapes of the sensitive areas, such as designing the sizes and shapes of the Electro-Static shielding layer and the insulating layer, designing the base layer, etc. Said Electro-Static shielding layer can completely cover all the sensitive areas, and the insulating layer can cover said Electro-Static shielding layer. The Electro-Static shielding apparatus designed in this way is also called a customized Electro-Static shielding apparatus, namely designing the Electro-Static shielding apparatus according to the sizes and shapes of the sensitive areas. Such a customized Electro-Static shielding apparatus covers and only covers the sensitive areas. Therefore, said customized Electro-Static shielding apparatus can not only provide reliable electrostatic shielding protection, but also reduce the manufacture cost.

Figure 2:
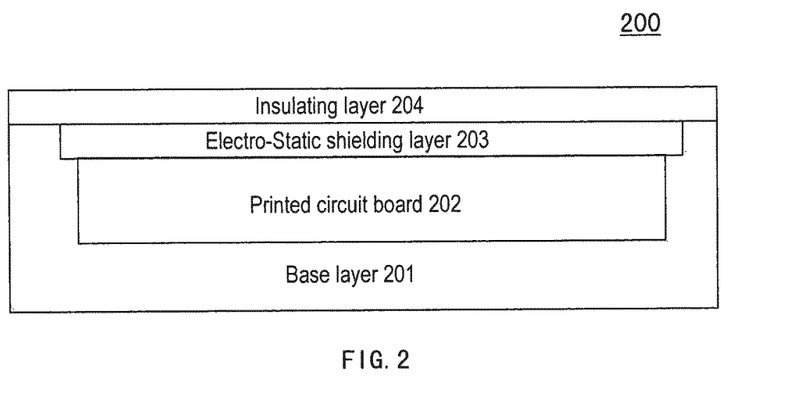
FIG. 2 schematically illustrates a diagram of an Electro-Static shielding apparatus according to one embodiment of the present invention.

Then referring to FIG. 2, one embodiment of the present invention is described in detail. FIG. 2 schematically illustrates a diagram of an Electro-Static shielding apparatus 200 according to one embodiment of the present invention.

As shown in FIG. 2, said Electro-Static shielding apparatus 200 may comprise a base layer 201 made of such as resin or plastic material. Certainly the material used for the base layer 201 is not limited to this, those skilled in the art can make suitable selections as required, as long as said base layer material is not conductive.

Said Electro-Static shielding apparatus may further comprise a printed circuit board 202 which can be embedded into the base layer 201. In the embodiments of the present invention, the printed circuit board is preferably a flexible printed circuit board (soft PCB), because the soft PCB can be easily embedded into the base layer due to its flexibility. Of course the embodiments of the present invention are not limited to the case of using the soft PCB.

In addition, the Electro-Static shielding apparatus 200 may further comprise an Electro-Static shielding layer 203 which is located on an upper surface of the base layer 201 and at least covers the sensitive areas that are areas corresponding to those required to be shielded in the printed circuit board. In one embodiment of the present invention, said sensitive areas may be areas corresponding to the printed circuit board; or alternatively, said sensitive areas may be areas corresponding to key components on the printed circuit board. Said Electro-Static shielding layer 203 may be made of conductive materials (such as conductive metals) so as to transport the electrostatic induced in the Electro-Static shielding layer 203 to the grounding point through metal wires (not shown) led from the Electro-Static shielding layer 203. The connecting manners and connecting points of the metal wires led from the Electro-Static shielding layer 203 are known in the art, thus will not be repeated herein.

The Electro-Static shielding apparatus 200 may further comprise an insulating layer 204 which at least covers the Electro-Static shielding layer 203. Said insulating layer 204 may be made of any materials suitable for providing insulation, preferably transparent flexible insulating materials.

FIG. 2 shows the situation in which the area of the insulating layer is larger than that of the Elector-Static shielding layer, but it is just schematic. In the respective embodiments of the present invention, the area of the insulating layer may be equal to that of the Electro-Static shielding layer, as long as it can completely cover the Electro-Static shielding layer. Preferably, the Electro-Static shielding layer is embedded into a reserved groove in the upper surface of the base layer and leveled with the upper surface of the base layer. That is, after embedding the Electro-Static shielding layer 203, the upper surface of the Electro-Static shielding layer 203 is in the same level surface with other portions in the upper surface of the base layer 201, as shown in FIG. 2. This can not only save the manufacture cost, but also make it possible to achieve the flatness as desired.

It is required to make it clear that the printed circuit board is embedded into a groove in the upper part of the base layer 201 in the embodiment shown in FIG. 2, but the present invention is not limited to this, it may also be embedded into different positions, such as the lower surface of the base layer.

As for different types of key components or electronic components, different electrostatic shielding design schemes may be required, namely different layer orders are required. The text below will specifically describe design schemes of Electro-Static shielding apparatus with regard to different electronic components by reference to FIGS. 3 and 4, wherein FIGS. 3 and 4 schematically illustrate electrostatic shielding design schemes with regard to two different types of electronic components, respectively.

Figure 3:
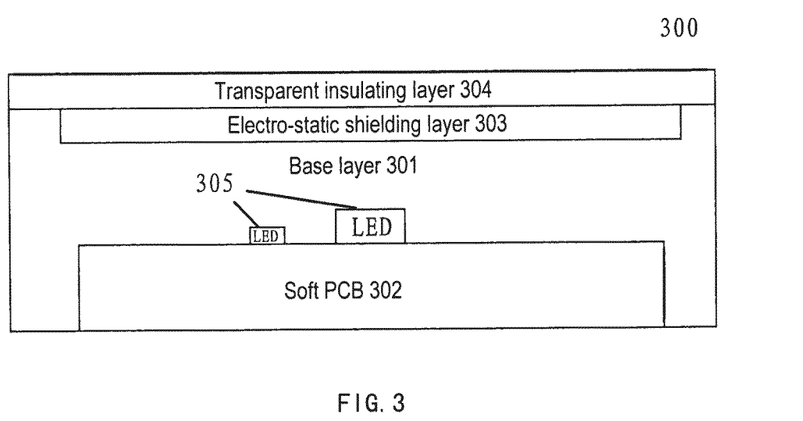
FIG. 3 schematically illustrates a diagram of an Electro-Static shielding apparatus according to another embodiment of the present invention.

Then referring to FIG. 3, FIG. 3 schematically illustrates an Electro-Static shielding apparatus 300 according to another embodiment of the present invention. As shown in FIG. 3, the surface of the printed circuit board such as soft PCB 302, which is provided with an element required to be shielded, is attached to a reserved groove in a lower surface of the base layer 301, and the soft PCB 302 is leveled with the lower surface of the base layer 301, namely the lower surface of the soft PCB 302 is in the same level surface with other portions in the lower surface of the base layer 301. During the manufacture process, the lower surface of the base layer may be designed with a groove cooperating with the soft PCB 302 which is provided with an element required to be shielded. Alternatively, the element required to be shielded is a light-emitting element, such as LED 305. FIG. 3 illustrates the situation of two types of LEDs with different sizes. In order to transmit light emitted from the LED as much as possible, the insulating layer 304, the Electro-Static shielding layer 303, and the base layer 301 are preferably made of the materials capable of transmitting light emitted from said light-emitting element.

Figure 4:
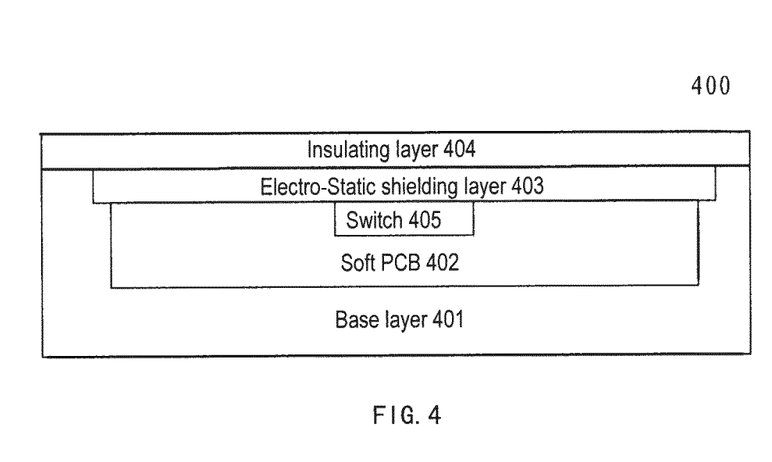
FIG. 4 schematically illustrates a diagram of an Electro-Static shielding apparatus according to another embodiment of the present invention.

Then referring to FIG. 4, FIG. 4 schematically illustrates an Electro-Static shielding apparatus 400 according to another embodiment of the present invention. As shown in FIG. 4, different from the apparatus 300 shown in FIG. 3, the surface of the printed circuit board such as soft PCB 402 which is opposite to the surface provided with the element required to be shielded is attached to the reserved groove in the upper surface of the base layer 401, the reserved groove preferably cooperates with the soft PCB 402 which is provided with the electrical components required to be shielded. FIG. 4 shows that it is provided with a switch 405 required to be shielded, such as a pressure sensitive switch or button switch. The switch 405 is attached to the upper surface of the soft PCB 402 and leveled with the upper surface of the soft PCB 402, namely the upper surface of the switch 405 is in the same level surface with other portions in the upper surface of the soft PCB 402. The lower surface of the soft PCB 402 is the surface opposite to the surface provided with the switch 405 required to be shielded. Preferably, the Electro-Static shielding layer 403 is attached to the surface of the printed circuit board such as soft PCB 402, which is provided with the element required to be shielded, and leveled with the upper surface of the base layer 401.

In addition, preferably the exposed trace on the printed circuit board such as soft PCB 402 is arranged on the surface of the printed circuit board which is opposite to the surface provided with the element required to be shielded so as to prevent the induced electrostatic from being conduced by the Electro-Static shielding layer 403 made of metal materials to the exposed trace on the soft PCB 402, which otherwise will cause failure of the whole electronic means or electronic device even the whole electronic system.

It is required to make it clear that FIGS. 3 and 4 respectively show the situations in which the soft PCB 302 and the soft PCB 402 are respectively provided with the LED 305 and the switch 405, but those skilled in the art may also conceive of mounting other key components in need of electrostatic shielding on the soft PCB according to the teaching of the present invention.

According to the schematic teaching from FIGS. 3 and 4, those skilled in the art know that the order of the respective layers in the Electro-Static shielding apparatus may be different for different key components required to be shielded. For example, as for the case of the light-emitting element in need of transmitting light, as shown in FIG. 3, it is preferred that the LED 305 is located between the upper surface of the soft PCB 302 and the base layer 301, this can modulate the brightness of light required to be transmitted according to the thickness of the base layer 301. That is, when the light quantity desired to be transmitted is relatively small, a relatively thick base layer 301 may be designed; and when the light quantity desired to be transmitted is relatively large, a relatively thin base layer 301 may be designed. With regard to how to design the thickness of the base layer 301 to modulate the brightness of the LED, it is easy for those skilled in the art to carry out according to the teaching of the present invention and the technical knowledge mastered by them, which will not be repeated herein for conciseness. In addition, in the embodiment shown in FIG. 3, when the light-emitting element such as LED 305 is used, the soft PCB 302 layer is designed as a bottom layer, which provides enough space for the base layer to modulate the tolerance in size and also can achieve better shielding effect. Therefore, preferably, in the Electro-Static shielding apparatus shown in FIG. 3, the order for arranging the respective layers from top to bottom can be the transparent insulting layer 305, the Electro-Static shielding layer 303, the base layer 301, and the soft PCB layer 302 provided with LED 305.

As for the circumstances in need of interaction with the outside, as shown in FIG. 4, when a pressure switch is employed as the key component on the soft PCB, the soft PCB 402 is preferably arranged at the position close to the external side, viz. the position close the Electro-Static shielding layer 403, this enables said switch 405 to be sensitive to the pressure from the outside, i.e. the pressure from the upper surface of the insulating layer 404. Therefore, preferably, in the Electro-Static shielding apparatus in which the switch 405 is required to be shielded as shown in FIG. 4, the order for arranging the respective layers from top to bottom can be the insulating layer 404, the Electro-Static shielding layer 403, the soft PCB 402 inside which the switch 405 is provided, and the base layer 401.

Therefore, from the diagrams schematically shown in FIGS. 3 and 4, it can be seen that with regard to different application requirements, the order for arranging the respective layers can be designed to meet its own requirement in order to achieve an optimal effect. However, it is required to make it clear that this is the optimum manner. For example, regarding the embodiments in FIGS. 3 and 4, the design scheme to exchange the respective layers is possible, but it cannot achieve the optimum effect.

In addition, as for ordinary electronic components with no special requirements, the respective layers thereof may be designed according to FIGS. 3 and 4, or designed using other manners. Those skilled in the art can design Electro-Static shielding apparatus with respect to various requirements according to the inventive theory of the present invention by reference to the schematic drawings. Moreover, it shall be further pointed out that use of different design process and layer orders would enable other performances of the Electro-Static shielding apparatus to be more flexible even enhanced.

In addition, in the schematic embodiments of the present invention, the Electro-Static shielding layer is preferably arranged close to the insulating layer as much as possible, thereby providing best electrostatic shielding effect. FIGS. 2-4 have shown such circumstances.

In addition, as for different electronic components, the base layer may be designed in a different way, namely it can be designed as being suitable for a specific electronic component, for example, the structures and shapes of the base layers in FIGS. 3 and 4 are base layer suitable for accommodating the soft PCB 302 and the soft PCB 402, respectively. In other words, the thickness of the whole base layer is not evenly distributed, in different design schemes, the grooves of different shapes and depths may be reserved in the upper surface, lower surface or other positions thereof. This can avoid protrusions and pits resulted from covering the electronic components protruded from the circuit board in the prior art. According to the preferred embodiment of the present invention, after both the soft PCB and the Electro-Static shielding layer have been embedded into or attached to the base layer, the external surface of the whole Electro-Static shielding apparatus is within an allowable flatness margin, which is good for the connections of the Electro-Static shielding apparatus with other electronic means and/or connecting means (not shown) in its circumference. Therefore, the structure, shape and thickness of the baser layer may be designed such that it is adapted for different applications, but this is not limited to PCB and electronic components, for example, it is also possible to adapt it for the Electro-Static shielding layer or other relevant components.

Figure 5:
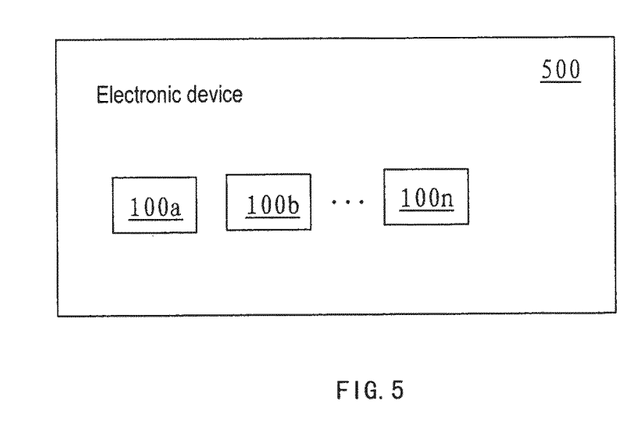
FIG. 5 schematically illustrates a diagram of an electronic device according to one embodiment of the present invention.

In addition, FIG. 5 further schematically illustrates an electronic device 500 according to one embodiment of the present invention. As shown in FIG. 5, the electronic device 500 comprises several Electro-Static shielding apparatus 100a, 100b . . . 100n, each Electro-Static shielding apparatus comprises a PCB that executes various functions. The electronic device 500 may be various electronic devices in need of electrostatic shielding, such as a transmitter, receiver, mobile phone, mobile computer, digital camera, etc.

Figure 6:
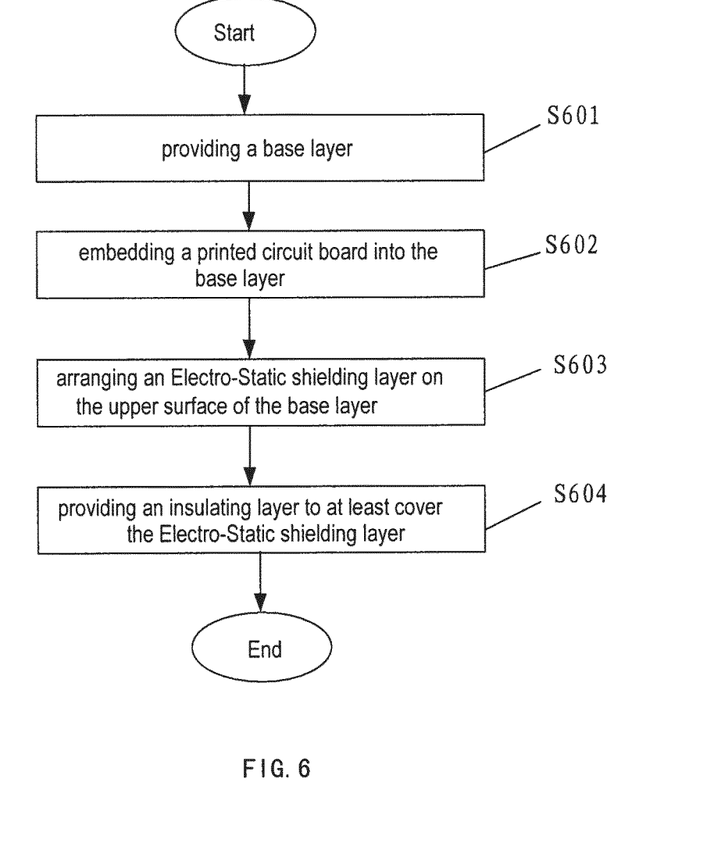
FIG. 6 schematically illustrates a flow chart of a method for manufacturing the Electro-Static shielding apparatus according to one embodiment of the present invention.

The text below will describe a method for manufacturing the Electro-Static shielding apparatus according to the present invention by reference to FIG. 6. FIG. 6 schematically illustrates a flow chart of a method for manufacturing the Electro-Static shielding apparatus.

As shown in FIG. 6, in step S601, a base layer may be first provided. Just as stated above, said base layer is specifically customized according to different electronic components in need of electrostatic shielding, which has an adaptive shape, structure and thickness.

Then in step S602, a printed circuit board is embedded into the base layer. In order to make the connection between the printed circuit board and the base layer more secure, an adhesive agent may be applied between them such that they are securely connected.

Then in step S603, an Electro-Static shielding layer is arranged on the upper surface of the base layer to at least cover the sensitive areas that are areas corresponding to those required to be shielded in the printed circuit board. The area of the Electro-Static shielding layer may be equal to or greater than that of the sensitive areas, thereby achieving complete electrostatic shielding effect. In addition, said Electro-Static shielding layer cannot be designed to be too large, because that will cause an increase in the cost. Therefore, it is preferred to design the Electro-Static shielding layer to merely cover the sensitive areas.

Then in step S604, an insulting layer is provided to at least cover said Electro-Static shielding layer, thereby providing effective insulation for the Electro-Static shielding layer made of conductive materials.

In one embodiment of the present invention, step S603 of arranging the Electro-Static shielding layer on the upper surface of the base layer may include: the Electro-Static shielding layer is embedded into a reserved groove in the upper surface of the base layer and leveled with the upper surface of the base layer. That is, after the Electro-Static shielding layer has been embedded into a reserved groove in the upper surface of the base layer, the upper surface of the printed circuit board is in the same level surface with other portions in the upper surface of the base layer.

In another embodiment of the present invention, step S602 of embedding the printed circuit board into the base layer may include: the surface of the printed circuit board which is provided with an element required to be shielded is attached to a reserved groove in a lower surface of the base layer, and the printed circuit board is leveled with the lower surface of the base layer. That is, the lower surface of the printed circuit board is in the same level surface with other portions in the lower surface of the base layer. The element required to be shielded may be a light-emitting element such as LED. Preferably, the insulating layer, the Electro-Static shielding layer, and the base layer are made of the materials capable of transmitting light emitted from said light-emitting element. During the manufacture, the light-emitting element such as LED may be embedded into the upper surface of the printed circuit board, and the brightness of light required to be transmitted may be modulated according to the thickness of the base layer.

In another embodiment of the present invention, step S602 of embedding the printed circuit board into the base layer may include the following step: the surface of the printed circuit board which is opposite to the surface provided with the element required to be shielded is attached to the reserved groove in the upper surface of the base layer. In such a case, step S603 of arranging the Electro-Static shielding layer on the upper surface of the base layer may include the following step: the Electro-Static shielding layer is mounted into the surface of the printed circuit board which is provided with the element required to be shielded, and leveled with the upper surface of the base layer.

In addition, preferably, the exposed trace on the printed circuit board is arranged on the surface of the printed circuit board which is opposite to the surface provided with the element required to be shielded. As stated above, this can prevent the induced electrostatic from being conduced by the Electro-Static shielding layer made of metal materials to the trace, which otherwise will cause failure of the whole electronic means or electronic device even the whole electronic system. The element required to be shielded is a switch.

In the above respective embodiments for the method for manufacturing the Electro-Static shielding apparatus of the present invention, said sensitive areas are areas corresponding to the printed circuit board. Alternatively, said sensitive areas are areas corresponding to key components on the printed circuit board.

In the above respective embodiments for the method for manufacturing the Electro-Static shielding apparatus of the present invention, the printed circuit board is preferably a flexible printed circuit board.

As disclosed above, according to the present invention, suitable shapes and sizes of the sensitive areas may be designed with regard to the electronic components in need of electrostatic shielding in the circuit board, and the circuit board may be embedded into the base layer. Therefore, it is possible to reduce the manufacture cost and improve the flatness of the apparatus while achieving good electrostatic shielding effect. Moreover, with regard to different types and sizes of the electronic components in need of electrostatic shielding, the order of the respective layers in the Electro-Static shielding apparatus can be specifically designed so as to achieve an optimal effect for the electronic components, for example, to guarantee the brightness, sensitivity and other performances of the electronic components.

Although the present invention is described by reference to the embodiments dial, can have been taken into consideration, it shall be understood that the present invention is not limited to the embodiments as disclosed. On the contrary, the present invention is intended to cover various modifications and equivalent arrangements included in the spirit and scope of the claims as enclosed. The scope of the following claims complies with the broadest explanation so as to involve all these modifications and equivalent structures and functions.

The invention claimed is:

1. An electro-static shielding apparatus, comprising:
   a base layer;
   a printed circuit board embedded into the base layer;
   an electro-static shielding layer located on an upper surface of the base layer and at least covering sensitive areas, the sensitive areas being those areas required to be shielded on the printed circuit board, wherein the electro-static shielding layer is embedded into a corresponding groove in the upper surface of the base layer and disposed so that an upper surface of the electro-static shielding layer is level with an uppermost surface of the base layer;
   an insulating layer covering at least the electro-static shielding layer.

2. The electro-static shielding apparatus of claim 1, wherein the electro-static shielding layer covers only the sensitive areas.

3. The electro-static shielding apparatus of claim 1:
   wherein a surface of the printed circuit board is both provided with an element required to be shielded and is mounted into a corresponding groove in a lower surface of the base layer;
   wherein the printed circuit board is level a lowermost surface of the base layer.

4. The electro-static shielding apparatus of claim 3, wherein the element required to be shielded is a light-emitting element.

5. The electro-static shielding apparatus of claim 4, wherein the insulating layer, the electro-static shielding layer, and the base layer are made of materials that can transmit light emitted from the light-emitting element.

6. The electro-static shielding apparatus of claim 1:
   wherein a first surface of the printed circuit board is provided with an element required to be shielded;
   wherein a second surface of the printed circuit board is disposed both opposite the first surface of the printed circuit board and in a corresponding groove of the base layer.

7. The electro-static shielding apparatus of claim 6, wherein the electro-static shielding layer is mounted onto the first surface of the printed circuit board.

8. The electro-static shielding apparatus of claim 6:
   wherein the printed circuit board includes an exposed trace on a first surface;
   wherein the printed circuit board is provided with the element required to be shielded disposed on a second surface of the printed circuit board, the second surface opposite the first surface.

9. The electro-static shielding apparatus of claim 6, wherein the element required to be shielded is a switch.

10. The electro-static shielding apparatus of claim 1, wherein the sensitive areas are areas corresponding to key components on the printed circuit board.

11. The electro-static shielding apparatus of claim 1, wherein the sensitive areas are areas corresponding to the printed circuit board.

12. The electro-static shielding apparatus of claim 1, wherein the printed circuit board is a flexible printed circuit board.

13. The electro-static shielding apparatus of claim 1, wherein the electro-static shielding apparatus comprises a portion of an electronic device.

14. A method for manufacturing the electro-static shielding apparatus, the method comprising:
   providing a base layer having an uppermost surface;
   embedding a printed circuit board into the base layer;
   arranging an electro-static shielding layer on an upper surface of the base layer so as to at least cover sensitive areas, the sensitive areas being those areas required to be shielded on the printed circuit board, wherein the electro-static shielding layer is embedded into a corresponding groove in the upper surface of the base layer and disposed so that an upper surface of the electro-static shielding layer is level with an uppermost surface of the base layer; and
   covering at least the electro-static shielding layer with an insulating layer.

\* \* \* \* \*

UNITED STATES PATENT AND TRADEMARK OFFICE
CERTIFICATE OF CORRECTION

PATENT NO.        : 9,072,161 B2                                Page 1 of 1
APPLICATION NO.   : 14/003110
DATED             : June 30, 2015
INVENTOR(S)       : He et al.

It is certified that error appears in the above-identified patent and that said Letters Patent is hereby corrected as shown below:

In Column 2, Line 12, delete "prior art," and insert -- prior art. --, therefor.

In Column 10, Line 12, delete "embodiments dial," and insert -- embodiments that --, therefor.

Signed and Sealed this
First Day of December, 2015

Michelle K. Lee
*Director of the United States Patent and Trademark Office*